(12) United States Patent
Motz et al.

(10) Patent No.: US 11,668,767 B2
(45) Date of Patent: Jun. 6, 2023

(54) APPARATUSES AND METHODS FOR ELECTRICAL CURRENT SENSING

(71) Applicant: Infineon Technologies AG, Neubiberg (DE)

(72) Inventors: Mario Motz, Wernberg (AT); Qinwen Fan, Zoetermeer (NL); Amirhossein Jouyaeian, The Hague (NL); Kofi Makinwa, Delft (NL)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/587,109

(22) Filed: Jan. 28, 2022

(65) Prior Publication Data

US 2022/0244322 A1 Aug. 4, 2022

(30) Foreign Application Priority Data

Jan. 29, 2021 (DE) .......................... 102021102051.4

(51) Int. Cl.
*G01R 33/00* (2006.01)
*G01R 15/18* (2006.01)
*H03F 3/45* (2006.01)
*G01R 15/20* (2006.01)
*G01R 33/07* (2006.01)
*G01R 19/32* (2006.01)

(52) U.S. Cl.
CPC ......... *G01R 33/0023* (2013.01); *G01R 15/18* (2013.01); *G01R 15/202* (2013.01); *G01R 19/32* (2013.01); *G01R 33/07* (2013.01); *H03F 3/45475* (2013.01); *G01R 33/0082* (2013.01); *G01R 33/075* (2013.01)

(58) Field of Classification Search
CPC .. G01R 33/0023; G01R 15/18; G01R 15/202; G01R 19/32; G01R 33/07; G01R 33/0082; G01R 33/075; G01R 33/0029; G01R 33/0041; G01R 33/0017; H03F 3/45475; H03F 2200/261; H03F 2200/462; H03F 2203/45526; H03F 1/30
USPC .............................. 324/143, 207.2, 234, 258
See application file for complete search history.

(56) References Cited

U.S. PATENT DOCUMENTS

| 3,381,230 | A | | 4/1968 | Gilbert et al. |
| 5,256,960 | A | | 10/1993 | Novini |
| 5,646,575 | A | * | 7/1997 | Sauer ................. H03F 1/083 330/261 |

(Continued)

OTHER PUBLICATIONS

Meyr, Dr. Heinrich. "Regelungstechnik und Systemtheorie." Wissenschaftsverlag Mainz. 1998. pp. 123-130.

*Primary Examiner* — Tung X Nguyen
*Assistant Examiner* — Robert P Alejnikov, Jr.
(74) *Attorney, Agent, or Firm* — Harrity & Harrity, LLP (57) ABSTRACT

The present disclosure relates to a magnetic field sensor circuit including at least one coil for measuring a magnetic field, a first stage amplifier circuit coupled to the coil and having a first transfer function with a pole at a first frequency, and a second stage amplifier circuit coupled to an output of the first stage amplifier circuit and having a second transfer function with a zero at the first frequency. In some embodiments, a temperature dependent frequency drift of the pole of the first transfer function corresponds to a temperature dependent frequency drift of the zero of the second transfer function.

17 Claims, 9 Drawing Sheets

(56) References Cited

U.S. PATENT DOCUMENTS

| | | | |
|---|---|---|---|
| 6,094,044 A * | 7/2000 | Kustera | G01R 15/18 |
| | | | 324/127 |
| 6,150,875 A | 11/2000 | Tsinker | |
| 6,556,077 B2 * | 4/2003 | Schaffer | H03F 3/4595 |
| | | | 330/69 |
| 6,611,174 B1 | 8/2003 | Sherman | |
| 2007/0247141 A1 * | 10/2007 | Pastre | G01R 33/07 |
| | | | 324/202 |
| 2019/0025346 A1 * | 1/2019 | Latham | G01R 15/202 |
| 2019/0383859 A1 * | 12/2019 | Hurwitz | G01R 15/181 |
| 2020/0292632 A1 * | 9/2020 | Hikichi | G01D 3/036 |
| 2021/0018573 A1 * | 1/2021 | Vuillermet | G01R 15/205 |

* cited by examiner

APPARATUSES AND METHODS FOR ELECTRICAL CURRENT SENSING

RELATED APPLICATION

This application claims priority to German Patent Application No. 102021102051.4, filed on Jan. 29, 2021, which is incorporated herein by reference in its entirety.

FIELD

The present disclosure generally relates to apparatuses and methods for sensing magnetic fields and/or electrical currents and, more particularly, to magnetic current sensors and sensing methods.

BACKGROUND

Magnetic (current) sensors may be used in switched-mode power supplies and motor drivers, where both galvanic isolation and wide bandwidth (BW) are desired. In CMOS, Hall-effect sensors are widely used, but their resistance results in a fundamental trade-off between BW and resolution. Coils have a differentiating characteristic and thus can achieve much wider BW and resolution but cannot sense direct current (DC). By using Hall sensors for low frequencies and coils for high frequencies, wide-band hybrid sensors can be realized. For example, two Hall/coil pairs may sense a differential magnetic field around a current rail, thus rejecting common mode (CM) external fields. In one example, however, its front-end senses coil voltage, which limits its high-frequency dynamic range (DR) and requires a DC servo loop based on a large external capacitor. In another example, the front-end senses the current of a single coil, and thus achieves wider bandwidth, at the expense of robustness to disturbance fields which interact as CM fields. Moreover, its Hall and coil paths are combined off-chip, and it achieves lower resolution and dissipates more power.

Thus, there may be a demand for improved magnetic current sensors.

SUMMARY

This demand is met by apparatuses and methods in accordance with the independent claims. Some beneficial embodiments are addressed by the dependent claims.

According to a first aspect, the present disclosure proposes a magnetic field sensor circuit which may also be used as a current sensor circuit. The magnetic field sensor circuit includes at least one coil (inductance) for measuring a magnetic field. For example, the magnetic field may be caused by an electrical current. The magnetic field sensor circuit further includes a first stage amplifier circuit coupled to the coil and having a first transfer function with a pole at a first frequency. The magnetic field circuit further includes a second stage amplifier circuit coupled to an output of the first stage amplifier circuit and having a second transfer function with a zero at the first frequency.

A zero of the transfer function denotes a root of the transfer function's numerator polynomial, while a pole of the transfer function denotes a root of the transfer function's denominator polynomial. A pole frequency corresponds to a corner frequency at which the slope of the transfer function's magnitude curve decreases by 20 dB/decade, and a zero frequency corresponds to a corner frequency at which the slope increases by 20 dB/decade.

While the pole of the first transfer function at the first frequency may limit an overload effect from the coil caused by high frequency (AC) magnetic fields (currents), the zero of the second transfer function at the same first frequency may compensate this pole, resulting in an essentially flat overall transfer function around the first frequency.

In some embodiments, a first filter circuit included in the first stage amplifier circuit is configured to have a temperature dependent frequency drift of the pole of the first transfer function. This may be due to respective temperature coefficients of circuit components of the first filter circuit. A second filter circuit included in the second stage amplifier circuit is configured to have a temperature dependent frequency drift of the zero of the second transfer function. Again, this may be due to respective temperature coefficients of circuit components of the second filter circuit. In accordance with embodiments of the present disclosure, the temperature dependent frequency drift of the pole of the first transfer function essentially corresponds to the temperature dependent frequency drift of the zero of the second transfer function. The essentially equal temperature dependent frequency drifts of the pole and the zero can be obtained by implementing resistors and capacitors of the first and second filter circuits of the same type. For example, when a resistor of the first filter circuit is implemented as a n-poly resistor, the corresponding resistor in the second filter circuit should also be implemented as a n-poly resistor. For another example, when a resistor of the first filter circuit is implemented as a diffusion resistor, the corresponding resistor in the second filter circuit should also be implemented as a diffusion resistor.

In some embodiments, a ratio r of a temperature coefficient of resistors used in the first and second filter circuits and a temperature coefficient of a resistance of the coil is within $0.9 \leq r \leq 1.2$. The temperature coefficient of resistance (TCR) is the calculation of a relative change of resistance per degree of temperature change. It is measured in ppm/°C. (1 ppm=0.0001%) and is defined as: TCR=(R2−R1)/R1 (T2−T1). For example, the temperature coefficient of the resistance of the coil may correspond to the temperature coefficient of a metal resistor. Therefore, the resistors used in the first and second filter circuits could also be implemented as metal resistors, or as resistors of a type having a temperature coefficient similar to metal resistors.

In some embodiments, the first stage amplifier circuit includes a first RC filter coupled between an input and an output of a first amplifier. The first RC filter causes the pole at the first frequency and may thus be considered as a lowpass filter. The second stage amplifier circuit includes a second RC filter coupled between an input and an output of a second amplifier. The second RC filter causes the zero at the first frequency and may thus be considered as a high pass filter. One or more resistors of the first RC filter and one or more resistors of the second RC filter may both be implemented as silicided polysilicon resistors (poly resistors). More particularly, the resistor(s) of the first RC filter and the resistor(s) of the second RC filter may both be implemented as silicided n-poly resistors. This is under the assumption that the magnetic field sensor circuit or at least pats thereof are implemented in complementary metal-oxide-semiconductor (CMOS) technology. Integrated circuits (ICs) often require integrated resistors for proper circuit operation. Typically, such resistors include doped polycrystalline silicon. To lower the resistances present in the poly resistors, a metal silicide layer can be formed across the top of the doped polycrystalline silicon or be blocked from formation across the top of the doped polycrystalline silicon. This metal silicide option enables two different types of polycrystalline silicon resistors. The first type with the metal silicide layer across the top of the doped polycrystalline silicon is referred as a "silicided polycrystalline silicon resistor" (silicided poly resistor), and the electrical conduction of this resistor is via the metal silicide layer. The second type without the metal silicide layer across the top of the doped polycrystalline silicon is referred as "non-silicided polycrystalline silicon resistor" (non-silicided poly resistor). The electrical conduction for the second type is by the polycrystalline silicon, thus depending on the doping (p- or n-doped) into the polycrystalline silicon.

The temperature coefficient of resistance of silicided polysilicon resistors is similar to that of metal resistors. In some embodiments, a ratio r of a temperature coefficient of the silicided polysilicon resistors and a temperature coefficient of a (metal) resistance of the coil is within $0.9 \leq r \leq 1.2$.

In some embodiments, the second stage amplifier circuit is configured to have—in addition to the zero at the first frequency—a pole of the second transfer function at a second frequency. Thus, the second stage amplifier circuit also includes a lowpass filter component. In some embodiments, the second frequency of the pole is lower than the first frequency of the zero.

In some embodiments, the magnetic field sensor circuit further includes a RC high-pass filter circuit coupled between the first stage amplifier circuit and the second stage amplifier circuit. The RC high-pass filter circuit has a third transfer function with a pole at a third frequency. In some embodiments, the third frequency is lower than the first frequency and lower than the second frequency.

In some embodiments, one or more resistors of the RC high-pass filter circuit between the first stage amplifier circuit and the second stage amplifier are implemented as non-silicided polysilicon resistors. While silicided polysilicon resistors may have relatively high TCR similar to metal resistors, non-silicided polysilicon resistors may have a considerably lower TCR. Thus, the pole at the third frequency may experience no or only little temperature dependent frequency drift.

In some embodiments, the magnetic field sensor circuit further includes a Hall sensor circuit coupled to an input of the second stage amplifier circuit.

In some embodiments, the Hall sensor circuit includes at least one spinning current Hall sensor and a chopper amplifier circuit coupled between the spinning current Hall sensor and the second stage amplifier circuit. Chopper amplifiers, hereafter also referred to as chopper amplifier circuits, are a type of amplifier in which a signal to be amplified is modulated (chopped), amplified and demodulated again. By using such a technique, switching noise can be shifted to a frequency band that is not of interest, and so-called 1/f noise can be reduced. Such chopper amplifiers can be used, for example, in bandgap circuits that provide a defined reference voltage, but can also be used in other applications where a signal needs to be amplified, such as amplifying measurement signals.

In some embodiments, the magnetic field sensor circuit further an RC lowpass filter circuit coupled between an output of the chopper amplifier circuit and an input of the second stage amplifier circuit. For example, this RC lowpass filter circuit can be used to filter out undesired Chopper ripple.

In some embodiments, the Hall sensor circuit includes a temperature dependent current source coupled to the spinning current Hall sensor. The temperature dependent current source allows to compensate for temperature dependent resistance variations in the Hall sensor circuit.

In some embodiments, the second stage amplifier circuit includes an RC lowpass filter coupled between an input and an output of an amplifier. One or more resistors of the RC lowpass filter of the second stage amplifier circuit is implemented as silicided polysilicon resistor and one or more resistors of the RC lowpass filter coupled between the output of the chopper amplifier circuit and the input of the second stage amplifier circuit are implemented as non-silicided polysilicon resistors.

According to a further aspect, the present disclosure proposes a current sensor circuit including a current rail, a first coil arranged at a first position of the current rail, a second coil arranged at a second position of the current rail. A first stage differential amplifier circuit is coupled to the first and second coil and has a first transfer function with a pole at a first frequency. A second stage differential amplifier circuit is coupled to an output of the first stage differential amplifier circuit and has a second transfer function with a zero at the first frequency. A temperature dependent frequency drift of the pole of the first transfer function corresponds to a temperature dependent frequency drift of the zero of the second transfer function. Such a differential arrangement may lead to more robustness to stray fields.

In some embodiments, the current rail may be integrated with the current sensor circuit. In some embodiments, the current rail may be external from the current sensor circuit.

In some embodiments, the current sensor circuit further includes a first spinning current Hall sensor arranged at the first position of the current rail, a first differential chopper amplifier circuit coupled between the first spinning current Hall sensor and the second stage differential amplifier circuit, a second spinning current Hall sensor arranged at the second position of the current rail, and a second differential chopper amplifier circuit coupled between the second spinning current Hall sensor and the second stage differential amplifier circuit.

According to a further aspect, the present disclosure proposes a method of magnetic field sensing. The method includes capturing a magnetic field (e.g., caused by the electrical current) with at least one coil, coupling the coil to a first stage amplifier circuit having a first transfer function with a pole at a first frequency, coupling an output of the first stage amplifier circuit to a second stage amplifier circuit to having a second transfer function with a zero at the first frequency. A temperature dependent frequency drift of the pole of the first transfer function corresponds to a temperature dependent frequency drift of the zero of the second transfer function.

Embodiments of the present disclosure allow allows low-noise, high bandwidth, high accurate and low offset systems. Further, better energy efficiency and weight and package size may be achieved with systems using higher frequencies and with lower remaining errors in regulation loops.

BRIEF DESCRIPTION OF THE DRAWINGS

Some examples of apparatuses and/or methods will be described in the following by way of example only, and with reference to the accompanying figures, in which FIG. 1 schematically illustrates a high-level block diagram of a magnetic field sensor circuit in accordance with embodiments of the present disclosure;

FIGS. 6-1 and 6-2 shows a more detailed schematic of the hybrid magnetic field sensor circuit of FIG. 5;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
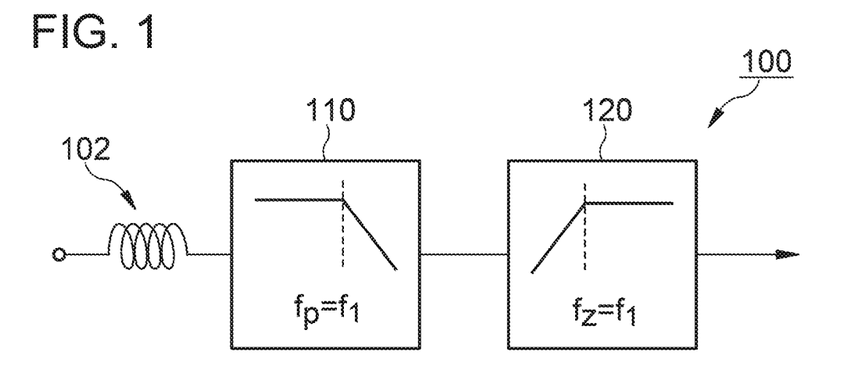

FIG. 1 schematically illustrates a high-level block diagram of magnetic field sensor circuit 100 in accordance with embodiments of the present disclosure.

The magnetic field sensor circuit 100 comprises a coil 102 for measuring a magnetic field e.g. caused by an electrical current (AC) through an electrical conductor in vicinity of the coil 102. The electrical conductor may be a current rail, a conductor path of an IC, or another electrical conductor, such as a wire. The electrical current causes a changing magnetic field around the electrical conductor. This changing magnetic field in return induces a current/voltage in the coil 102 according to Faraday's law of induction.

The magnetic field sensor circuit 100 further comprises a first stage amplifier circuit 110 coupled to terminals of the coil 102. The first stage amplifier circuit 110 may comprise a first stage amplifier and a first stage filter circuit having a first stage transfer function with a pole at a first frequency $f_{p1}$. This first (pole) frequency $f_{p1}$ corresponds to a corner frequency at which the slope of the first stage transfer function's magnitude curve decreases by 20 dB/decade. Thus, the first stage filter circuit may comprise a lowpass filter. The first stage filter circuit with the pole at frequency $f_{p1}$ may limit an output swing of the coil 102 for (current) frequencies above $f_1$.

The magnetic field sensor circuit 100 further comprises a second stage amplifier circuit 120 coupled to an output of the first stage amplifier circuit 110 and having a second transfer function with a zero at the first frequency $f_{z2}=f_{p1}$. This zero frequency $f_{z2}=f_{p1}$ corresponds to a corner frequency at which the slope of the second stage transfer function's magnitude curve increases by 20 dB/decade. Thus, the second stage filter circuit may comprise a high pass filter.

The zero at frequency $f_{z2}=f_{p1}$ may compensate the pole at frequency $f_{p1}$ such that a magnitude curve of an overall transfer function of the first and second stage amplifier circuits 110 is essentially flat at frequency $f_{p1}$.

In some embodiments, coil 102, the first stage amplifier circuit 110 and the second stage amplifier circuit 120 may be integrated in a common IC. The electrical conductor may be external to the IC.

The skilled person having benefit from the preset disclosure will appreciate that a resistance of coil 102 may be temperature dependent. For example, in case of a metal coil, the temperature coefficient of resistance (TCR) may be in the range of +0.36%/K. This temperature dependency of the coil's resistance may be compensated by a corresponding temperature dependency of the pole of the first stage transfer function and the zero of the second stage transfer function at frequency $f_{p1}$. Therefore, the first stage filter circuit included in the first stage amplifier circuit 110 may have a temperature dependent frequency drift of the pole frequency $f_{p1}$. The second stage filter circuit included in the second stage amplifier circuit 120 may have a temperature dependent frequency drift of the zero frequency $f_{z2}=f_{p1}$. According to embodiments of the present disclosure the temperature dependent frequency drift of the pole frequency $f_{p1}$ of the first transfer function may correspond to the temperature dependent frequency drift of the zero frequency $f_{z2}=f_{p1}$ of the second transfer function. In this way, the zero at frequency $f_{z2}=f_{p1}$ may compensate the pole at frequency $f_{p1}$ over a broad temperature range.

Ideally, the temperature dependent frequency drifts of the pole and zero frequency $f_{p1}$ correspond to that of the coil's transfer function which means that resistances used in the first and second stage filter circuits controlling the pole and zero at frequency $f_{p1}$ should have an identical or at least similar TCR as the TCR of the coil 102. A ratio r of a TCR of the resistances used in the first and second stage filter circuits controlling the pole and zero at frequency $f_{z2}=f_{p1}$ and a TCR of the coil may be within 0.9≤r≤1.2, for example.

Thus, resistors used in the first and second stage filter circuits controlling the pole and zero at frequency $f_{z2}=f_{p1}$ may be metal resistors having the same TCR as the coil 102. Since the latter may not be feasible for implementing resistors in typical semiconductor processes for implementing ICs, however, silicided polysilicon resistors may be chosen as resistors in the first and second stage filter circuits controlling the pole and zero at frequency $f_{z2}=f_{p1}$. Silicided polysilicon resistors are polysilicon resistors with one or more silicide layers on top of the polysilicon. A silicide is a compound that has silicon with (usually) more electropositive elements. Some examples are Nickel silicide, NiSi, Sodium silicide, $Na_2Si$, Magnesium silicide, $Mg_2Si$, Platinum silicide, PtSi (platinum is actually more electronegative than silicon), Titanium silicide, $TiSi_2$, Tungsten silicide, $WSi_2$, Molybdenum disilicide, $MoSi_2$. In some embodiments, the TCR of the silicided polysilicon resistors (TCR) used in the first and second stage filter circuits controlling the pole and zero at frequency $f_{z2}=f_{p1}$ may be in the range of +0.31%/K, for example, which is in the same order of magnitude than that of the coil (+0.36%/K).

Figure 2:
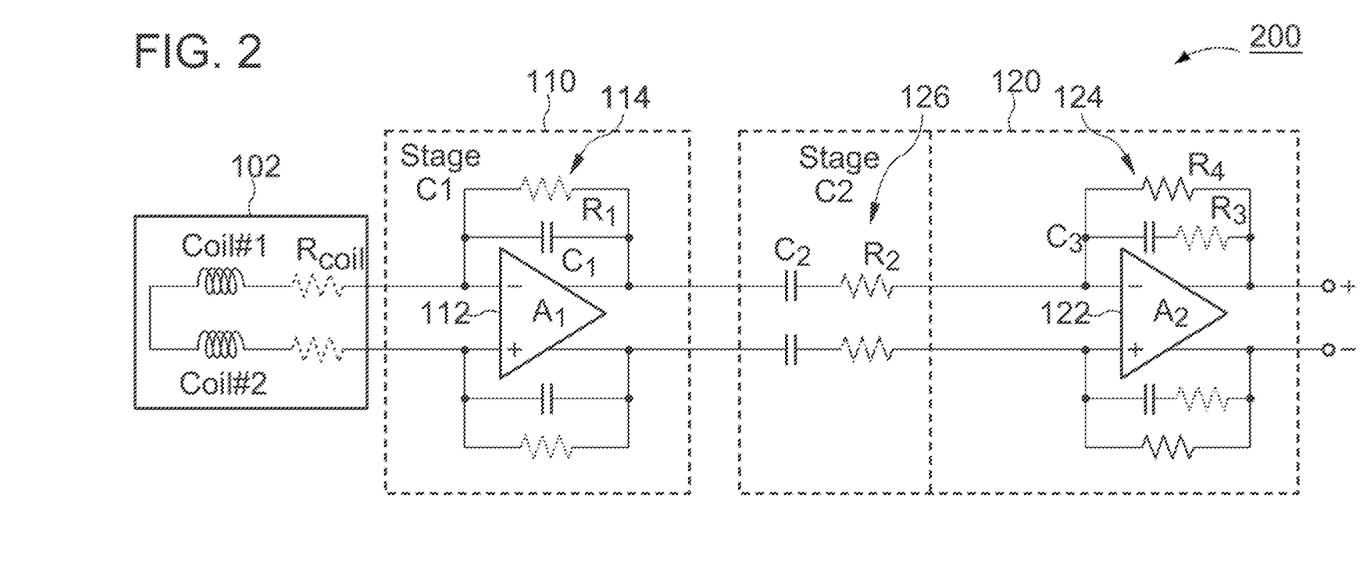
FIG. 2 illustrates a magnetic field sensor circuit using coils in accordance with an embodiment of the present disclosure.

FIG. 2 illustrates a magnetic field sensor circuit 200 in accordance with an embodiment of the present disclosure.

Magnetic field sensor circuit 200 may be stand-alone or may be a coil path of a wide-band hybrid magnetic field sensor where an additional Hall sensor is used for low frequencies. Although FIG. 2 illustrates an example using a coil pair (coil #1, coil #2) for sensing a differential magnetic field around a current conductor (e.g., current rail), the skilled person having benefit from the present disclosure will appreciate that the differential setup can be straightforwardly replaced by an embodiment using only a single coil.

Magnetic field sensor circuit 200 comprises a differential coil pair 102 including coil #1 and coil #2, a first stage amplifier circuit 110, and a second stage amplifier circuit 120. Coil #1 of the differential coil pair 102 has a resistance $R_{coil}$ (e.g., (3.3 kΩ) and is coupled to an inverting input terminal of a first stage amplifier 112 of first stage amplifier circuit 110. Coil #2 of the differential coil pair 102 has a resistance $R_{coil}$ and is coupled to a non-inverting input terminal of the first stage amplifier 112. For example, $R_{coil}$ may be a metal resistance with a TCR of +0.36%/K.

Figure 3:
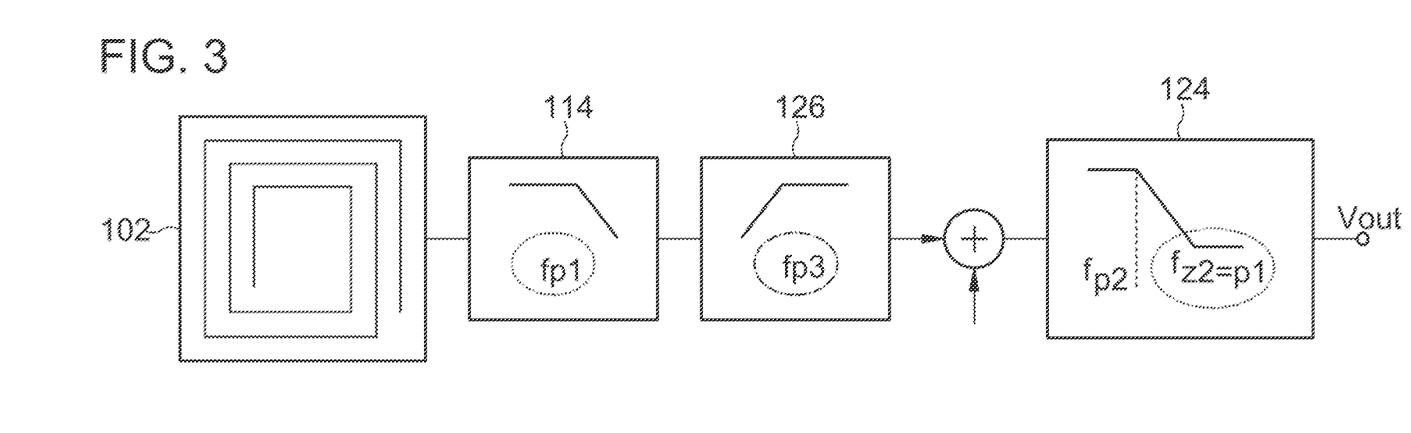
FIG. 3 shows a high-level block diagram of the magnetic field sensor circuit of FIG. 2.

The first stage amplifier circuit 110 comprises an RC filter 114 coupled between an input and an output of the first stage amplifier 112. The RC filter 114 in this example comprises an inverting filter branch coupled between inverting input and output terminals of the first stage amplifier 112. The inverting filter branch comprises a resistor $R_1$ in parallel to a capacitor $C_1$. The RC filter 114 in this example comprises a further non-inverting branch comprising a resistor $R_1$ in parallel to a capacitor $C_1$ coupled between non-inverting input and output terminals of the first stage amplifier 112. The skilled person having benefit from the present disclosure will appreciate that only one filter branch may be need in case of a non-differential setup. The RC filter 114 comprising the resistor $R_1$ in parallel to capacitor $C_1$ causes the pole at the first frequency $f_{p1}$. This is schematically shown in FIG. 3.

According to embodiments, resistor(s) $R_1$ may be implemented as silicided polysilicon resistor and may have a TCR of +0.31%/K, for example. A resistance of resistor $R_1$ may be 32 kΩ, for example. A capacitance of capacitor $C_1$ may be 25 pF, for example. Since the TCRs the silicided polysilicon resistor $R_1$ and the TCR of coil resistance $R_{coil}$ are similar, the gain of the first stage amplifier circuit 110 will remain essentially constant over a broad temperature range.

The second stage amplifier circuit 120 in this example comprises an RC high pass filter 126 coupled between the output terminal(s) of the first stage amplifier 112 and input terminals of a second stage amplifier 122. The RC high pass filter 126 in this example comprises an inverting filter branch coupled between the inverting output terminal of the first stage amplifier 112 and the inverting input terminal of the second stage amplifier 122. The inverting filter branch of RC high pass filter 126 comprises a resistor $R_2$ in series to a capacitor $C_2$. The RC high pass filter 126 in this example comprises a further non-inverting filter branch (with resistor $R_2$ in series to capacitor $C_2$) coupled between the non-inverting output terminal of the first stage amplifier 112 and the non-inverting input terminal of the second stage amplifier 122. The non-inverting filter branch of RC high pass filter 126 also comprises a resistor $R_2$ in series to a capacitor $C_2$. The RC high-pass filter circuit 126 has a transfer function with a pole at frequency $f_{p3}<f_{p1}$. This is schematically shown in FIG. 3.

Resistor(s) $R_2$ may be implemented as non-silicided polysilicon resistor and may have a TCR of −0.02%/K, for example. A resistance of resistor $R_2$ may be 480 kΩ, for example. A capacitance of capacitor $C_2$ may be 260 pF, for example. Since the TCR resistor $R_2$ is very small the pole frequency $f_{p3}$ will essentially remain constant over a broad temperature range.

An RC filter 124 is coupled between an input and an output of the second stage amplifier 122. The RC filter 124 in this example comprises an inverting filter branch coupled between inverting input and output terminals of the second stage amplifier 122. The inverting filter branch comprises a resistor $R_3$ in series to a capacitor $C_3$ and a resistor $R_4$ in parallel to the series connection of resistor $R_3$ and capacitor $C_3$. The RC filter 124 in this example comprises a further non-inverting branch coupled between non-inverting input and output terminals of the second stage amplifier 122. The non-inverting filter branch also comprises a resistor $R_3$ in series to a capacitor $C_3$ and a resistor $R_4$ in parallel to the series connection of resistor $R_3$ and capacitor $C_3$. The skilled person having benefit from the present disclosure will appreciate that only one filter branch may be need in case of a non-differential setup. The series connection of resistor $R_3$ and capacitor $C_3$ of RC filter 124 forms a high pass filter and causes the zero at frequency $f_{p1}$, thus $f_{z2}=f_{p1}$, while resistor $R_4$ and capacitor $C_3$ of RC filter 124 form a lowpass filter and may be configured to cause a pole at frequency $f_{p2}<f_{p1}$. This is schematically shown in FIG. 3.

Resistor(s) $R_3$ may be implemented as silicided polysilicon resistors and may have a TCR of +0.31%/K, for example. A resistance of resistor $R_3$ may be 32 kΩ, for example. A capacitance of capacitor $C_3$ may be 25 pF, for example. In this way, $f_{z2}=f_{p1}$ over a broad temperature range. Further, the temperature dependent frequency drift of $f_{p1}$ essentially corresponds to the temperature dependent frequency drift of $f_{z2}$. Since the TCR of the silicided polysilicon resistors $R_1$, $R_3$ resemble that of metal resistor $R_{coil}$, the temperature dependent frequency drifts of $f_{p1}$ and $f_{z2}$ are adapted to the temperature dependent drift of $R_{coil}$.

Figure 4:
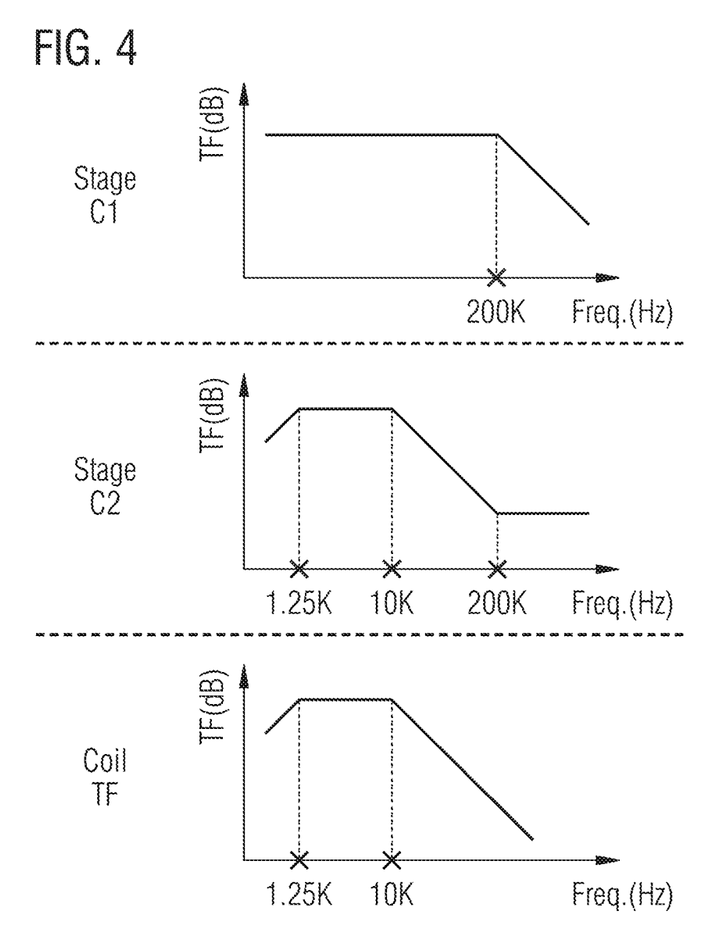
FIG. 4 shows Bode plots of the different stages of the magnetic field sensor circuit of FIG. 2.

As shown in the upper Bode plot of FIG. 4, the RC filter 114 comprising the resistor $R_1$ in parallel to capacitor $C_1$ may cause a pole at a frequency $f_{p1}=200$ kHz, for example. The pole frequency $f_{p1}=200$ kHz corresponds to a corner frequency at which the slope of the RC filter 114 transfer function's magnitude curve decreases by 20 dB/decade. As shown in the middle Bode plot of FIG. 4, the RC filter 126 comprising the resistor $R_2$ in series to capacitor $C_2$ may cause a pole at a frequency $f_{p3}=1.25$ kHz, for example. The pole frequency $f_{p3}$=1.25 kHz corresponds to a corner frequency at which the slope of the RC filter 126 transfer function's magnitude curve decreases by 20 dB/decade. The lowpass filter portion formed by resistor $R_4$ and capacitor $C_3$ of RC filter 124 may cause a pole at frequency $f_{p2}$=10 kHz. The high pass filter portion formed by resistor $R_3$ and capacitor $C_3$ of RC filter 124 may cause a zero at frequency $f_{z2}$=$f_{p1}$=200 kHz. The overall transfer function of stage 1 and stage 2 is shown in the lower Bode plot of FIG. 4.

As mentioned before, the magnetic field sensor circuit 200 of FIG. 2 may be a coil path of a wide-band hybrid magnetic field sensor. As shown in the simplified block diagram of FIG. 5, an additional Hall sensor path may be used for low frequencies, resulting in a hybrid magnetic field sensor.

Figure 5:
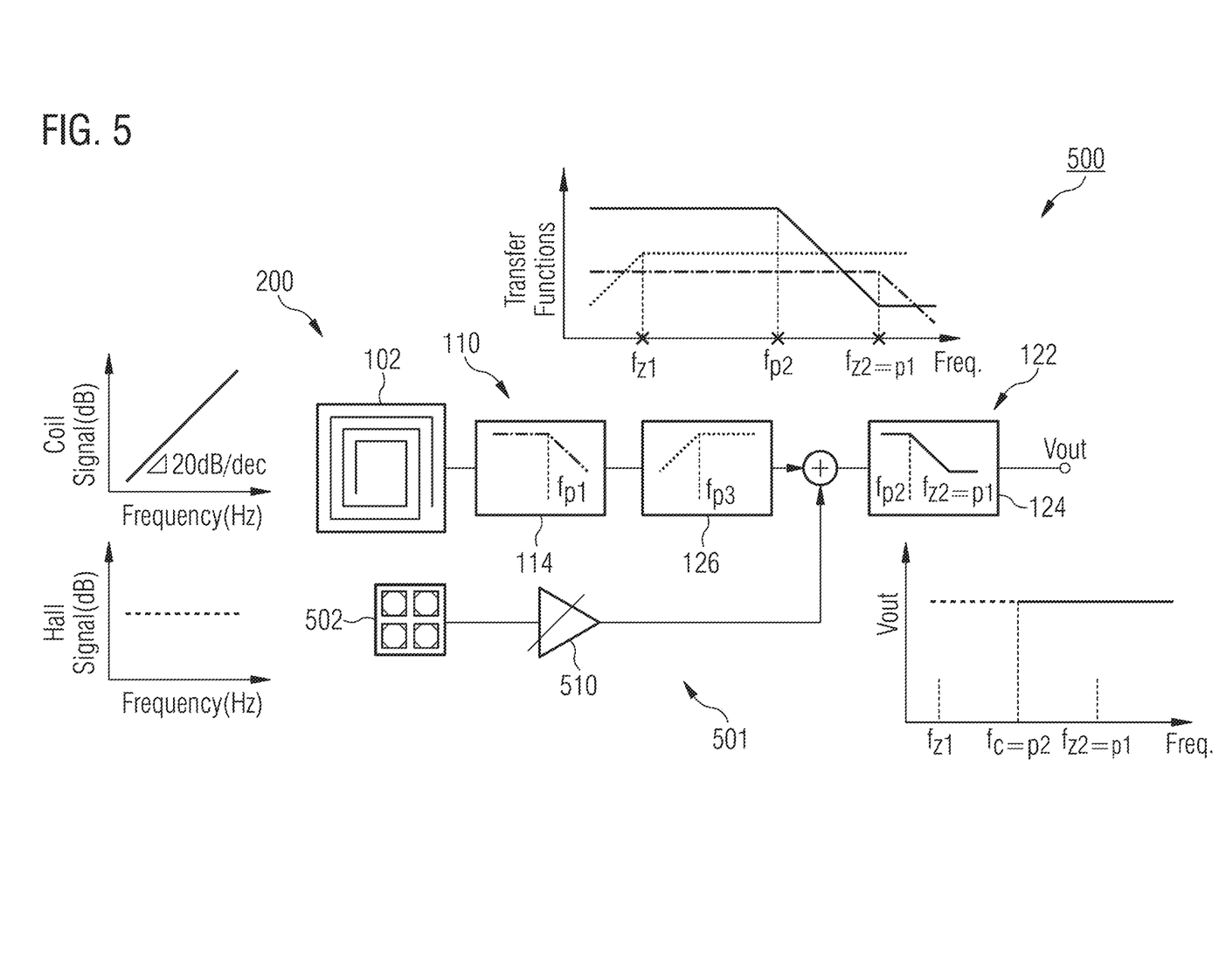
FIG. 5 schematically illustrates a high-level block diagram of a hybrid magnetic field sensor circuit including a coil path and a Hall path in accordance with embodiments of the present disclosure.

The hybrid magnetic field sensor circuit 500 of FIG. 5 comprises the coil path 200 for high frequencies and an additional Hall path 501 for low frequencies. The Hall path 501 comprises a Hall sensor circuit coupled to an input of the second stage amplifier 122. The Hall sensor circuit may comprise at least one spinning current Hall sensor 502 and a chopper amplifier circuit 510 coupled between the spinning current Hall sensor 502 and the second stage amplifier 122.

Figure 61:
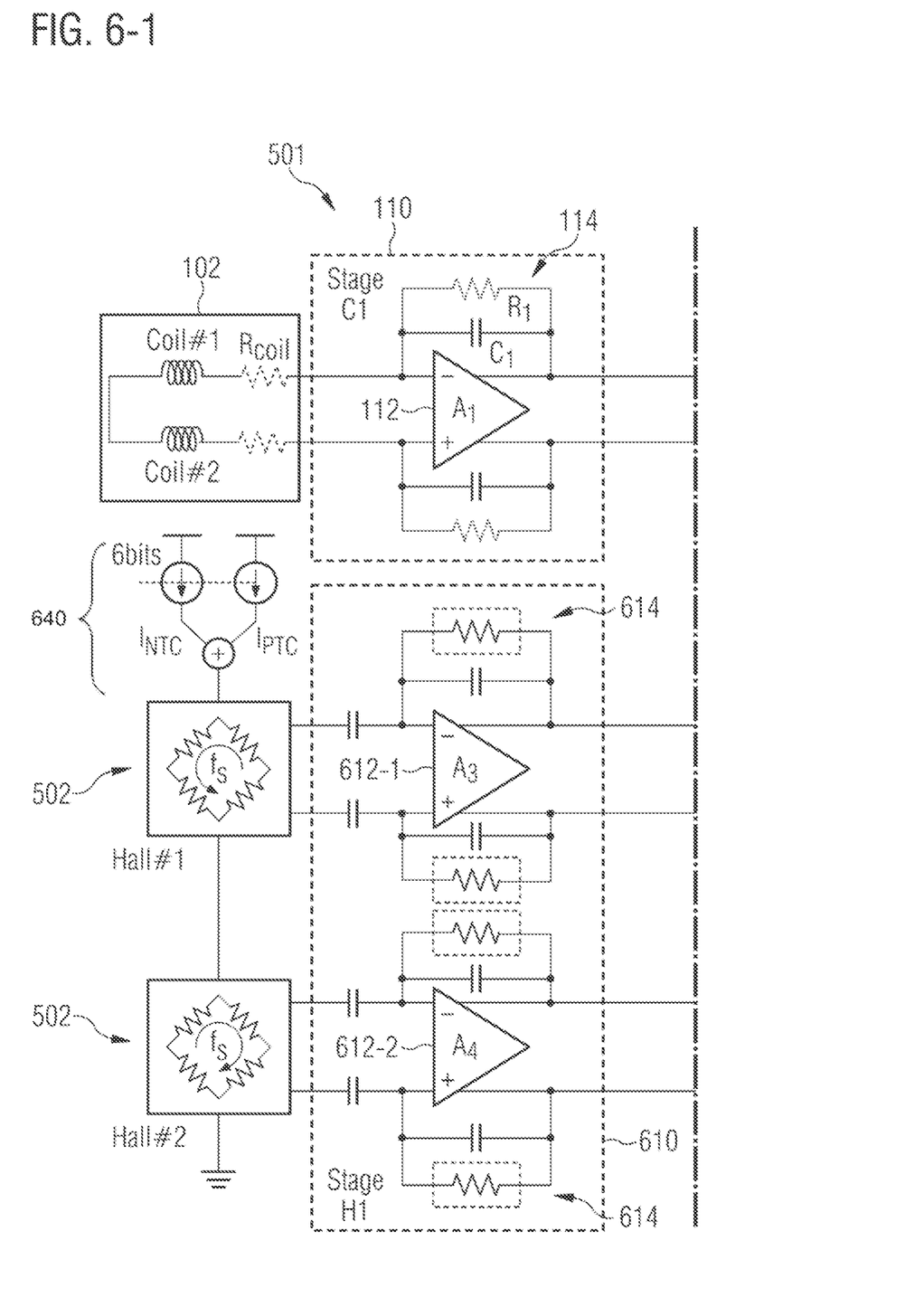
Figure 62:
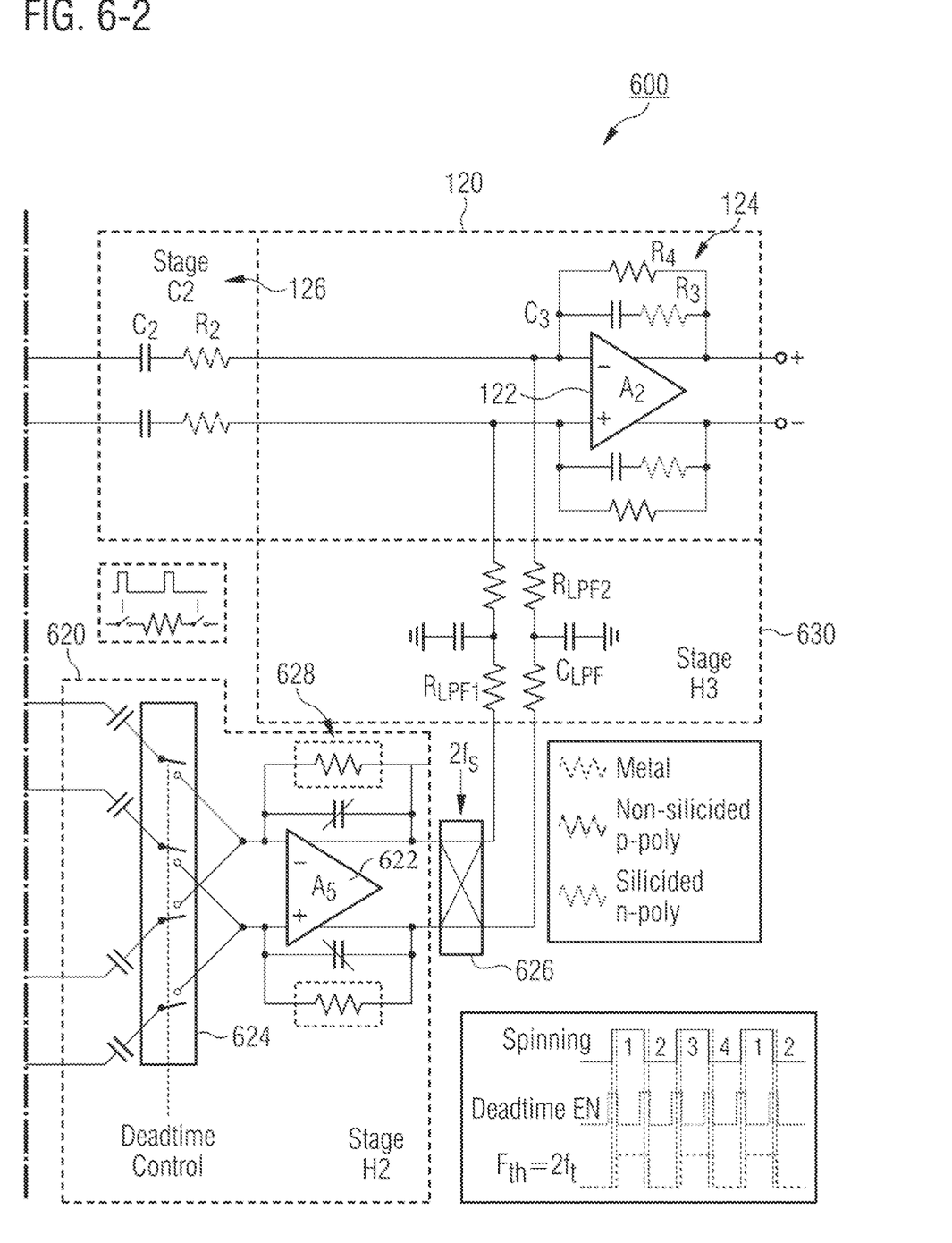

FIGS. 6-1 and 6-2 illustrate a detailed schematic of a wide-band hybrid current sensor 600 in accordance with embodiments of the present disclosure. FIGS. 6-1 and 6-2 are conjoined at the right-most or left-most hashed line, respectively, to illustrate a complete schematic diagram of the wide-band hybrid current sensor 600.

The Hall path 501 of hybrid current sensor 600 comprises a differential pair of spinning current Hall sensors 502 including Hall #1 and Hall #2, a first Hall-stage amplifier circuit 610, a second Hall-stage amplifier circuit 620, and a lowpass filter circuit 630 of the Hall path 501. The lowpass filter circuit 630 is coupled between an output of the second Hall-stage amplifier circuit 620 and the input of the second stage amplifier 122. The differential pair of spinning current Hall sensors 502 including Hall #1 and Hall #2 is coupled between one or more (biasing) current sources 640 and ground.

A first Hall voltage output of the first spinning current Hall sensor Hall #1 is capacitively coupled to an inverting input of a first amplifier 612-1 of first Hall-stage amplifier circuit 610. A second Hall voltage output of the first spinning current Hall sensor Hall #1 is capacitively coupled to a non-inverting input of the first amplifier 612-1. The first Hall-stage amplifier circuit 610 comprises a lowpass RC filter 614 coupled between an input and an output of the first amplifier 612-1. The RC filter 614 in this example comprises an inverting filter branch coupled between inverting input and output terminals of the first amplifier 612-1. The inverting filter branch comprises a resistor in parallel to a capacitor. The RC filter 614 in this example comprises a further non-inverting branch comprising a resistor in parallel to a capacitor coupled between non-inverting input and output terminals of the first amplifier 612-1. The skilled person having benefit from the present disclosure will appreciate that only one filter branch may be need in case of a non-differential setup.

A first Hall voltage output of the second spinning current Hall sensor Hall #2 is capacitively coupled to an inverting input of a second amplifier 612-2 of first Hall-stage amplifier circuit 610. A second Hall voltage output of the second spinning current Hall sensor Hall #2 is capacitively coupled to a non-inverting input of the second amplifier 612-2. The first Hall-stage amplifier circuit 610 comprises a lowpass RC filter 614 coupled between an input and an output of the second amplifier 612-2. The RC filter 614 in this example comprises an inverting filter branch coupled between inverting input and output terminals of the second amplifier 612-2. The inverting filter branch comprises a resistor in parallel to a capacitor. The RC filter 614 in this example comprises a further non-inverting branch comprising a resistor in parallel to a capacitor coupled between non-inverting input and output terminals of the second amplifier 612-2. The skilled person having benefit from the present disclosure will appreciate that only one filter branch may be need in case of a non-differential setup.

Inverting and non-inverting outputs of the first and second amplifiers 612-1, 612-2 of the first Hall-stage amplifier circuit 610 are capacitively coupled to second stage amplifier circuit 620 including a chopper amplifier 622 with modulator and demodulator circuits 624, 626. By means of the modulator circuit 624, the inverting and non-inverting outputs of the first and second amplifiers 612-1, 612-2 of the first Hall-stage amplifier circuit 610 may be alternatingly capacitively coupled to the inverting and non-inverting inputs of the chopper amplifier 622. A chopping frequency $f_{ch}$ of the modulator circuit's 624 switches may correspond to twice a frequency $f_s$ of the spinning current Hall sensors Hall #1, Hall #2. Inverting and non-inverting outputs of the chopper amplifier 622 are coupled to demodulator circuit 626, also operating at chopping frequency $f_{ch}$. The second Hall-stage amplifier circuit 620 comprises a lowpass RC filter 628 coupled between an input and an output of the chopper amplifier 622. The RC filter 628 in this example comprises an inverting filter branch coupled between inverting input and output terminals of the chopper amplifier 622. The inverting filter branch comprises a resistor in parallel to a capacitor. The RC filter 628 in this example comprises a further non-inverting branch comprising a resistor in parallel to a capacitor coupled between non-inverting input and output terminals of the chopper amplifier 622. The skilled person having benefit from the present disclosure will appreciate that only one filter branch may be need in case of a non-differential setup.

Inverting and non-inverting outputs of the demodulator circuit 624 are coupled to inputs of lowpass filter 630. Lowpass filter 630 comprises a first branch comprising a series connection of resistors $R_{LPF1}$, $R_{LPF2}$, where $R_{LPF1}$ interfaces demodulator circuit 624 and $R_{LPF2}$ interfaces a first, differential input of second stage amplifier 122. A capacitor $C_{LPF}$ of the first branch is coupled between ground and a node between resistors $R_{LPF1}$, $R_{LPF2}$ of the first branch. Lowpass filter 630 comprises a second, differential branch comprising a series connection of resistors $R_{LPF1}$, $R_{LPF2}$, where $R_{LPF1}$ interfaces demodulator circuit 624 and $R_{LPF2}$ interfaces a second, differential input of second stage amplifier 122. A capacitor $C_{LPF}$ of the second branch is coupled between ground and a node between resistors $R_{LPF1}$, $R_{LPF2}$ of the second branch.

In some embodiments, the one or more current sources 640 may deliver temperature dependent biasing currents for the Hall sensors 502 including Hall #1 and Hall #2 in order to compensate for a temperature dependent resistance change of the Hall sensors 502 including Hall #1 and Hall #2. In such embodiments, the resistors $R_{LPF1}$, $R_{LPF2}$ of the RC lowpass filter 630 may be implemented as non-silicided polysilicon resistors and resistor $R_4$ of the RC lowpass filter 122 may be implemented as silicided polysilicon resistor. In this way, the gain of second (coil-) stage amplifier 122 will be temperature dependent to cause an overall flat transfer function over a broad temperature range.

Some embodiments of the present disclosure present a hybrid current sensor that can measure a differential field around a lead-frame-based current rail. By sensing coil current and employing a pole-zero cancellation scheme, its front-end may achieves high dynamic range (DR) and resolution without external components.

Figure 7:
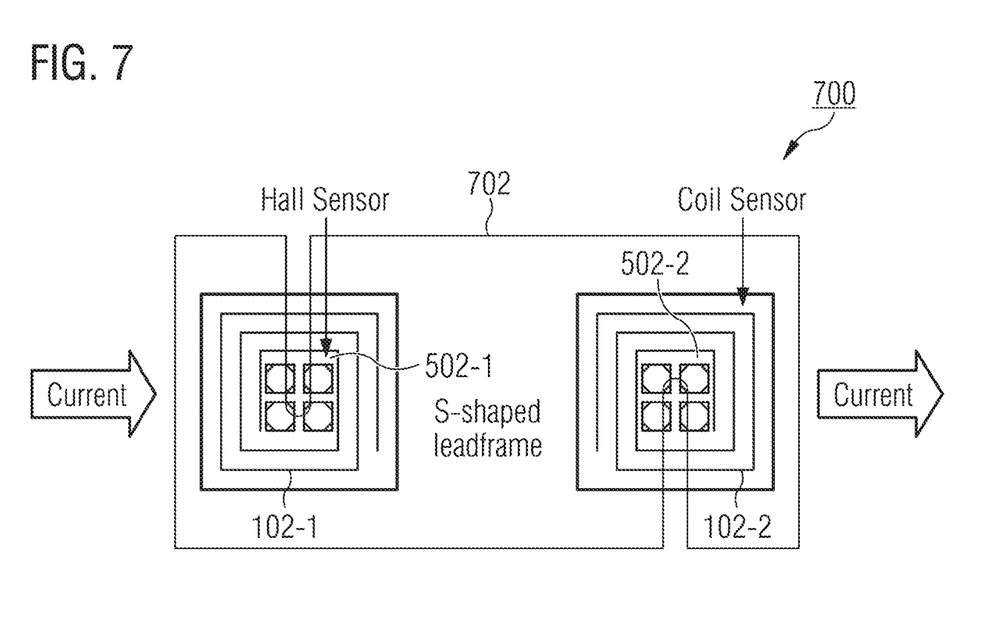
FIG. 7 shows a setup of the hybrid current sensor circuit applied to a current rail.

FIG. 7 illustrates a current sensor circuit 700 comprising a current rail 702, a first coil 102-1 arranged at a first position of the current rail 702, a second coil 102-2 arranged at a second position of the current rail 702. A first stage differential amplifier circuit 110 (not shown) is coupled to the first and second coil 102-1, 102-2 having a first transfer function with a pole at a first frequency. A second stage differential amplifier circuit 120 (not shown) is coupled to an output of the first stage differential amplifier circuit 110 and has a second transfer function with a zero at the first frequency. Optionally, a first spinning current Hall sensor 502-1 may be arranged at the first position of the current rail 702 and a second spinning current Hall sensor 502-2 may be arranged at the second position of the current rail 702. A first differential chopper amplifier circuit 610, 620 (not shown) may be coupled between the first spinning current Hall sensor 502-1 and the second stage differential amplifier circuit 120. A second differential chopper amplifier circuit 610, 620 may be coupled between the second spinning current Hall sensor 502-2 and the second stage differential amplifier circuit 120.

The current rail 702 may comprise a low-resistance (e.g., 250µΩ) S-shaped lead-frame, which may concentrate a magnetic field seen by the Hall/coil pairs Hall #1, Hall #2 and coil #1 and coil #2. Each Hall sensor Hall #1, Hall #2 may comprise four spinning-current Hall plates connected in parallel. The currents in the plates may be designed to flow in different directions, resulting in a significant reduction of offset and stress sensitivity.

A simplified block diagram of the Hall and coil paths 501, 200 is shown in FIG. 5. Since coil current is proportional to the derivative of lead-frame current ($I_{rail}$), the coil path 200 comprises a two-stage integrator. The first stage 110 comprises a trans-impedance amplifier 112 with a pole at $f_{p1}$, which ensures that high-frequency components of $I_{rail}$ do not cause its output to clip. To block offset, its output is AC-coupled to the second stage 120, where it is combined with the output of the Hall path 501. The second stage implements a pole at $f_{p2}$ and a zero at $f_{z2}=f_{p1}$, thus realizing a coil path with a pole at $f_{p2}$. By appropriately setting the gain of the Hall path 501, the overall transfer function is flat, while the Hall sensor's thermal noise may be filtered above the crossover frequency $f_c=f_{p2}$, which may be chosen to balance the noise contributions of the coil and Hall paths.

Figure 8:
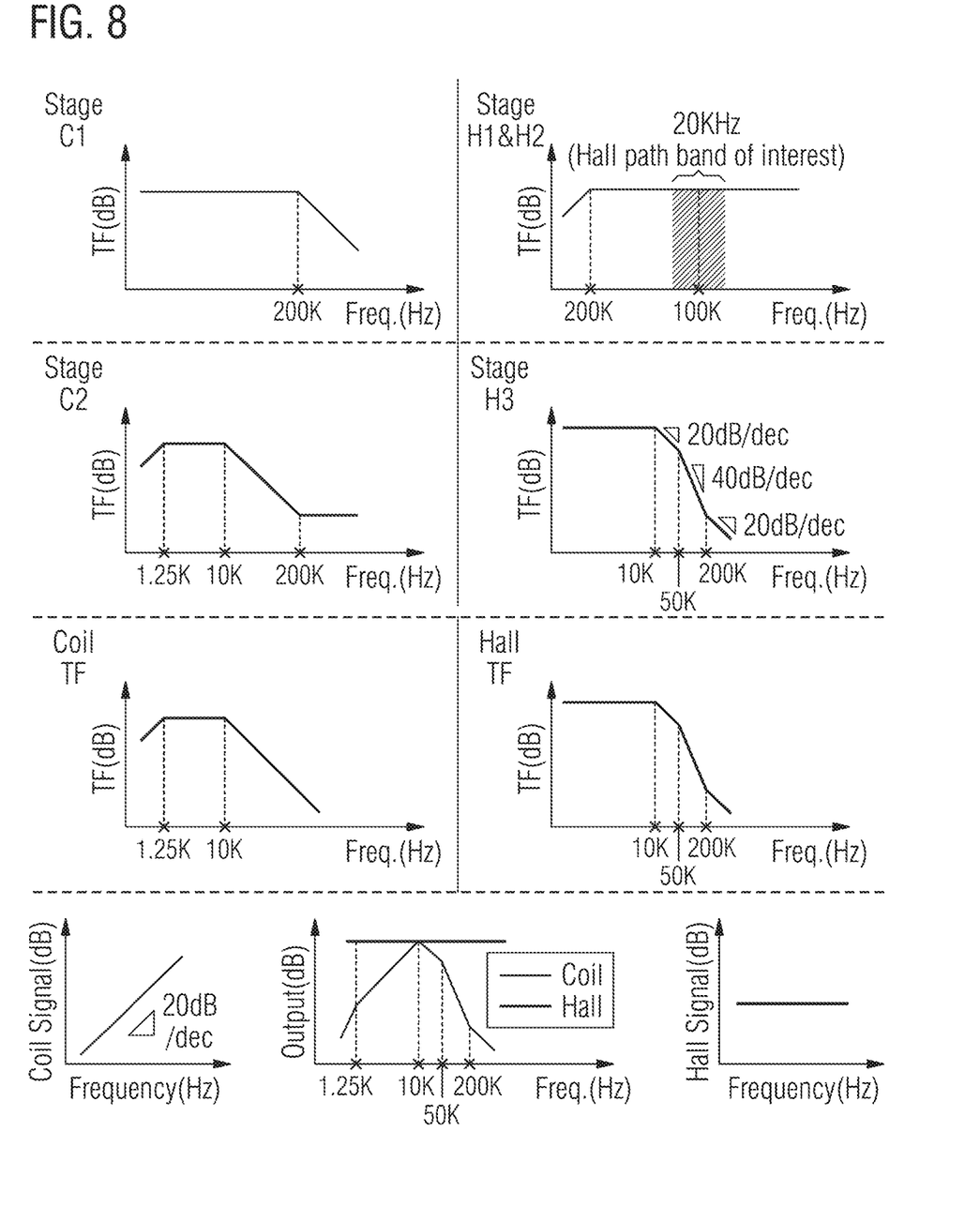
FIG. 8 shows Bode plots of the different stages of the current sensor circuit of FIGS. 6-1 and 6-2.

A more detailed schematic of the current sensor is shown in FIGS. 6-1 and 6-2, and the corresponding Bode plots are shown in FIG. 8.

The first stage 110 of the coil path 200 may, for example, realize $f_{p1}$=200 kHz ($R_1C_1$). Above this frequency, $C_1$ (e.g., 25 pF) may limit its output swing to ~1.125V when $I_{rail}$~25 A. The second stage 120 may realize $f_{z2}$=200 kHz ($R_3C_3$) and $f_{p2}$=10 kHz ($R_4C_3$). The coil path 200 thus behaves like an integrator with a 10 kHz pole, as shown in FIG. 8 (left). Although this could be done in a single stage, $R_1$ would be very large (e.g., 3MΩ), which, together with the low coil resistance $R_{coil}$ (e.g., 3.3 kΩ), would cause the output of the first stage 110 to clip on its own offset (~2 mV). The proposed architecture allows $R_1$ to be small (32 k first stage 110), resulting in ~20 mV offset at the output of the first stage 110. This is then blocked by $C_2$ (260 pF), which together with $R_2$ (e.g., 480 kΩ) defines a pole at 1.25 kHz, and thus has a negligible effect above $f_c$. The offset of the second stage 120 may be amplified by a gain of 2 (e.g., $R_4=R_{LPF1}+R_{LPF2}$), and so it also has a negligible effect (~4 mV) on the front-end's output offset. To ensure robustness to spread, the time constants $R_1C_1$ and $R_3C_3$ may be realized by the same type of components. Also, the large temperature coefficient (TCR=0.36%/K) of $R_{coil}$ may be cancelled by realizing $R_{1,3}$ with silicided n-poly resistors (TCR=0.31%/K). $R_2$ may be implemented with a p-poly resistor, whose low TCR (−0.02%/K) leads to an overall coil-path TCR of 0.03%/K.

To minimize a power consumption of their biasing circuitry 640, the two spinning Hall sensors 502-1 502-2 may be stacked. The TCR of their sensitivity may be compensated by biasing them with a temperature-dependent current (e.g., ~4 mA at room temperature) which may be derived from two currents with positive ($I_{PTC}$) and negative ($I_{NTC}$) TCRs, as shown in FIGS. 6-1 and 6-2. These may be implemented by forcing PTAT (proportional to absolute temperature) and CTAT (complementary to absolute temperature) voltages $\Delta V_{GS}$ and $V_{GS}$, generated by a pair of subthreshold biased PMOS transistors, across two resistors.

FIG. 8 (right) shows the transfer function of the various stages of the Hall path 501. To reduce Hall sensor offset, the spinning-current technique may be employed, in which the Hall voltage is up-modulated to twice the spinning frequency (for example, $2f_s$=100 kHz), while its offset remains at DC. Due to the lead-frame's dimensions, the distance between the two Hall sensors Hall #1 and Hall #2 may be rather large (e.g., ~2.4 mm). So, to maintain signal integrity, their outputs may be boosted by local capacitively-coupled amplifiers (CCAs) 612-1, 612-2 with a gain of 50 (first Hall-stage 610), before being summed and demodulated by a similar CCA 622 (second Hall-stage 620), which also may have a gain of 50. Amplifier 122 of stage 120 may then combine the outputs of the Hall and coil paths 200, 501. The CCAs may use switched-resistors to realize large DC feedback resistances (e.g., >1GΩ), which may establish zeros (~500 Hz) that may block the offsets of the Hall sensors and the first Hall-stage 610. The up-modulated offset of amplifier 622 may only experience unity gain and may be filtered by a 50 kHz LPF 630 realized by $R_{LPF1}$, $R_{LPF2}$, and $C_{LPF}$. After each spinning-current transition, deadband switches at the virtual ground of amplifier 622 may be used to block the resulting thermal settling transients of the Hall sensors, thus reducing their residual offset. Deadband denotes a band of input values in the domain of a transfer function where the output is zero (the output is 'dead'—no action occurs).

The ratio $R_4/(R_{LPF2}+R_{LPF1})$ may determine a constant gain over temperature and technology spread for the low-frequency Hall path 501: In case of constant current biasing of the Hall plates these resistors may be from the same type. In case of $I_{NTAT}$ current biasing of Hall plates with about −3000 ppm/K, these resistors may be from the different type and preferably $R_4$ may be a silicided resistor and $R_{LPF1}$ and $R_{LPF2}$ may be non-silicided resistors, to form a gain ratio with about 3000 ppm/K. In that case the Hall bias current with about −2500 . . . −3000 ppm/K is about:

$$Intat = \frac{Vbe}{Rpoly\_non\_silicide} \text{ or } Intat = \frac{Vconst}{Rpoly\_silicide} \text{ or } Intat = \frac{Vptat}{Rn\_vertical}$$

The Hall path 501 can also benefit for $R_{poly\text{-}silicide}/R_{poly\_non\_silicide}$:

Instead to for the Hall plate with constant current: $I_{ntat}$ biasing would lead to about $V_{ptat}$ biasing instead of +6000 ppm $V_{Hallbias}$ with $I_{const}$. It leads to about −3000 ppm/ sensitivity of Hall plate output voltage, but it can be compensated with $R_{poly\text{-}silicide}/R_{poly\_non\_silicide} \approx +3000$ ppm/K. The signal to noise ration S/N at 175° C. stays the same (limited to max $V_{hallbias}$). But at 25° and even more at −40° C. the S/N would be better (factor≈1.5).

For example, amplifiers 112, 122 may be Miller-compensated amplifiers, with folded-cascode input stages and class AB output stages to handle the induced coil currents, and drive external loads (20 pF), respectively. To maximize their noise efficiency, amplifiers 612-1, 612-2 may be telescopic current-reuse amplifiers. The equivalent input-referred noise of amplifier 112 and amplifiers 612-1, 612-2 may be designed to match the thermal noise of $R_{coil}$ (3.3 kΩ) and $R_{Hall}$ (700Ω), respectively.

Figure 9:
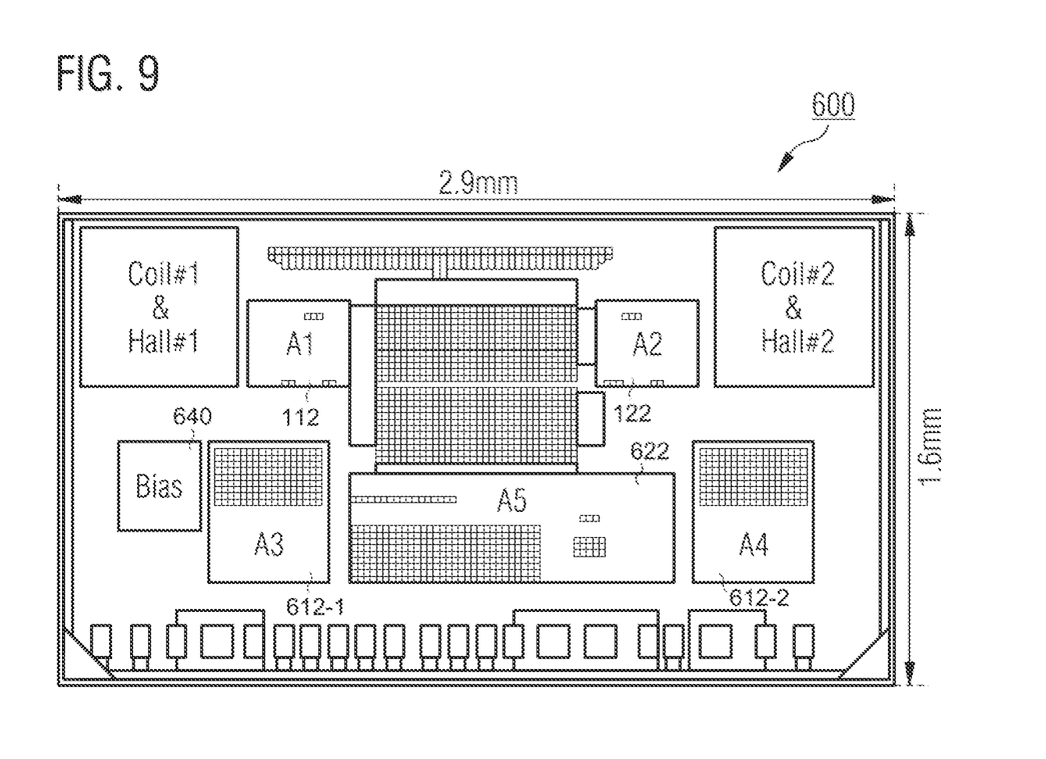
FIG. 9 shows an integrated current sensor circuit.

FIG. 9 shows an integrated current sensor circuit. For example, the integrated current sensor circuit may be the wide-band hybrid current sensor 600 described in connection with FIGS. 6-1 and 6-2. Thus, the integrated current sensor circuit may include the Hall/coil pair including coil #1 and Hall #1 arranged in a first area of the integrated current sensor circuit, the Hall/coil pair including coil #2 and Hall #2 arranged in a second area of the integrated current sensor circuit, the first stage amplifier 112 (e.g., A1) arranged in a third area of the integrated current sensor circuit, the second stage amplifier 122 (e.g., A2) arranged in a fourth area of the integrated current sensor circuit, the first amplifier 612-1 (e.g., A3) arranged in a fifth area of the integrated current sensor circuit, the second amplifier 612-1 (e.g., A4) arranged in a sixth area of the integrated current sensor circuit, the chopper amplifier 622 (e.g., A5) arranged in a seventh area of the integrated current sensor circuit, and the biasing circuitry 640 arranged in an eighth area of the integrated current sensor circuit.

Embodiments propose using a combination of a fast and low noise coil high frequency path and a low offset low frequency hall signal path. Embodiments propose using silicided (and non-silicided) resistors for pole-zero cancellation in both amplifying paths to compensate temperature coefficients, technology spread, stress dependencies, and pole-zero compensation to get a flat frequency behavior. Embodiments also propose a stress-compensated bias system.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A magnetic field sensor circuit, comprising:
   at least one coil configured to measure a magnetic field;
   a first stage amplifier circuit coupled to the at least one coil and having a first transfer function with a pole at a first frequency; and
   a second stage amplifier circuit coupled to an output of the first stage amplifier circuit and having a second transfer function with a zero at the first frequency, wherein a first filter circuit included in the first stage amplifier circuit is configured to have a temperature dependent frequency drift of the pole of the first transfer function, wherein a second filter circuit included in the second stage amplifier circuit is configured to have a temperature dependent frequency drift of the zero of the second transfer function, and wherein the temperature dependent frequency drift of the pole of the first transfer function corresponds to the temperature dependent frequency drift of the zero of the second transfer function.

2. The magnetic field sensor circuit of claim 1, wherein:

the first stage amplifier circuit comprises a first RC filter coupled between an input and an output of a first amplifier, the first RC filter causing the pole at the first frequency, the second stage amplifier circuit comprises a second RC filter coupled between an input and an output of a second amplifier, the second RC filter causing the zero at the first frequency, and a resistor of the first RC filter and a resistor of the second RC filter are both implemented as silicided polysilicon resistors.

3. The magnetic field sensor circuit of claim 2, wherein a ratio r of a temperature coefficient of the silicided polysilicon resistors and a temperature coefficient of a resistance of the at least one coil is within $0.9 \leq r \leq 1.2$.

4. The magnetic field sensor circuit of claim 1, wherein the second stage amplifier circuit is configured to have a pole of the second transfer function at a second frequency.

5. The magnetic field sensor circuit of claim 4, wherein the second frequency of the pole of the second transfer function is lower than the first frequency of the zero of the second transfer function.

6. The magnetic field sensor circuit of claim 4, further comprising:

an RC high-pass filter circuit coupled between the first stage amplifier circuit and the second stage amplifier circuit, the RC high-pass filter circuit having a third transfer function with a pole at a third frequency.

7. The magnetic field sensor circuit of claim 6, wherein the third frequency is lower than the first frequency and lower than the second frequency.

8. The magnetic field sensor circuit of claim 6, wherein one or more resistors of the RC high-pass filter circuit are implemented as non-silicided polysilicon resistors.

9. The magnetic field sensor circuit of claim 1, further comprising:

a Hall sensor circuit coupled to an input of the second stage amplifier circuit.

10. The magnetic field sensor circuit of claim 9, wherein the Hall sensor circuit comprises:

at least one spinning current Hall sensor; and a chopper amplifier circuit coupled between the at least one spinning current Hall sensor and the second stage amplifier circuit.

11. The magnetic field sensor circuit of claim 10, further comprising:

a first RC lowpass filter circuit coupled between an output of the chopper amplifier circuit and an input of the second stage amplifier circuit.

12. The magnetic field sensor circuit of claim 11, wherein the second stage amplifier circuit comprises a second RC lowpass filter coupled between an input and an output of an amplifier of the second stage amplifier circuit, wherein a resistor of the second RC lowpass filter of the second stage amplifier circuit is implemented as silicided polysilicon resistor and one or more resistors of the first RC lowpass filter coupled between the output of the chopper amplifier circuit and the input of the second stage amplifier circuit is implemented as a non-silicided polysilicon resistor.

13. The magnetic field sensor circuit of claim 10, wherein the Hall sensor circuit comprises a temperature dependent current source coupled to the at least one spinning current Hall sensor.

14. The magnetic field sensor circuit of claim 1, wherein:

each of the at least one coil is configured to generate a respective measurement signal representative of the magnetic field, the first stage amplifier circuit is configured to receive each respective measurement signal and apply the first transfer function thereto to generate at least one first stage output signal, and the second stage amplifier circuit is configured to apply the second transfer function to the at least one first stage output signal or to at least one signal derived from the at least one first stage output signal to generate at least one second stage output signal.

15. A current sensor circuit, comprising:

a current rail;

a first coil arranged at a first position of the current rail;

a second coil arranged at a second position of the current rail;

a first stage differential amplifier circuit coupled to the first coil and the second coil and having a first transfer function with a pole at a first frequency; and a second stage differential amplifier circuit coupled to an output of the first stage differential amplifier circuit and having a second transfer function with a zero at the first frequency, wherein a temperature dependent frequency drift of the pole of the first transfer function corresponds to a temperature dependent frequency drift of the zero of the second transfer function.

16. The current sensor circuit of claim 15, further comprising:

a first spinning current Hall sensor arranged at the first position of the current rail;

a first differential chopper amplifier circuit coupled between the first spinning current Hall sensor and the second stage differential amplifier circuit;

a second spinning current Hall sensor arranged at the second position of the current rail; and a second differential chopper amplifier circuit coupled between the second spinning current Hall sensor and the second stage differential amplifier circuit.

17. A method of magnetic field sensing, comprising:

capturing a magnetic field with at least one coil;

coupling the at least one coil to a first stage amplifier circuit having a first transfer function with a pole at a first frequency; and coupling an output of the first stage amplifier circuit to a second stage amplifier circuit having a second transfer function with a zero at the first frequency, wherein a temperature dependent frequency drift of the pole of the first transfer function corresponds to a temperature dependent frequency drift of the zero of the second transfer function.

* * * * *